United States Patent
Ali et al.

(10) Patent No.: US 8,305,814 B2
(45) Date of Patent: Nov. 6, 2012

(54) SENSE AMPLIFIER WITH PRECHARGE DELAY CIRCUIT CONNECTED TO OUTPUT

(75) Inventors: Shahid Ali, New Delhi (IN);
Raviprakash Suryanarayana Rao, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 417 days.

(21) Appl. No.: 12/616,797

(22) Filed: Nov. 12, 2009

(65) Prior Publication Data

US 2010/0124089 A1 May 20, 2010

(51) Int. Cl.
*G11C 11/34* (2006.01)
(52) U.S. Cl. ............. 365/185.21; 365/196; 365/205; 365/207

(58) Field of Classification Search ............. 365/185.21, 365/196, 205, 207
See application file for complete search history.

(56) References Cited

U.S. PATENT DOCUMENTS

| 7,242,629 B2* | 7/2007 | Luk et al. ............. 365/205 |
| 7,817,455 B2* | 10/2010 | Fredeman et al. ....... 365/96 |

* cited by examiner

*Primary Examiner* — Jason Lappas
(74) *Attorney, Agent, or Firm* — Lawrence J. Bassuk; W. James Brady; Frederick J. Telecky, Jr.

(57) ABSTRACT

Single-ended sense amplifier circuit. An example of the sense amplifier circuit includes an inverter coupled to a bit line to read a bit cell. The sense amplifier circuit also includes a first circuit responsive to a control signal to charge the bit line for a predefined time. Further, the sense amplifier circuit includes a second circuit coupled to the bit line and responsive to a read 1 operation to retain voltage of the bit line above a first threshold to render the inverter to read 1 from the bit cell.

3 Claims, 4 Drawing Sheets

SENSE AMPLIFIER WITH PRECHARGE DELAY CIRCUIT CONNECTED TO OUTPUT

REFERENCE TO PRIORITY APPLICATION

This application claims priority from Indian Provisional Application No. 2821/CHE/2008 filed on Nov. 17, 2008, entitled "A HIGH-SPEED SINGLE-ENDED SENSE AMPLIFIER FOR ROMs, CAMs, AND SINGLE-ENDED-READ RAMs", naming Texas Instruments Incorporated (the intended assignee) as the Applicant, and naming the same inventors as in the present application as inventors, which is incorporated herein by reference in its entirety.

TECHNICAL FIELD

Embodiments of the disclosure relate to a single-ended sense amplifier circuit.

BACKGROUND

A sense amplifier circuit is used in a memory, for example a complementary metal oxide semiconductor (CMOS) memory, to detect or sense stored data from a bit cell. Performance of the sense amplifier circuit impacts memory access time and power dissipation. A single-ended sense amplifier circuit requires low power and one input data signal, and provides high noise immunity as compared to a differential sense amplifier circuit.

A conventional single-ended sense amplifier circuit 100, hereinafter referred to as the circuit 100, is illustrated in FIG. 1 (Prior Art). The circuit 100 is responsive to a control signal (SENB) to perform read operations. Initially, SENB is at logic level HI and DIN is at logic level LO. A transistor 105 is active. SENB then moves to a logic level LO. A transistor 110 becomes active and charges a bit line 115 through a diode 120. If operation is a read "0" operation then a bit cell coupled to the bit line 115 forces the bit line 115 to logic level LO. Hence, strength of the diode 120 is made less in order to prevent opposition of the bit cell by the diode 120 and to read "0" at output of an inverter 125. However, having the diode 120 with less strength leads to undesired delay during a read "1" operation. The bit line 115 is charged slowly due to presence of the diode 120. Also, strength of a transistor 130 is made high as compared to a transistor stack 135 to prevent opposition by the transistor stack 135 during a read "0" operation. However, having the transistor stack 135 with less strength leads to undesired delay during a read "1" operation. The undesired delay due to the diode 120 and the transistor stack 135 may lead to false reading. Moreover, the false reading increases with process, voltage and temperature variations.

SUMMARY

An example of a sense amplifier circuit includes an inverter coupled to a bit line to read a bit cell. The sense amplifier circuit also includes a first circuit responsive to a control signal to charge the bit line for a predefined time. Further, the sense amplifier circuit includes a second circuit coupled to the bit line and responsive to a read 1 operation to retain voltage of the bit line above a first threshold to render the inverter to read 1 from the bit cell.

An example of a circuit includes an inverter coupled to a bit line to read a bit cell. The circuit also includes a pre-charge circuit coupled to the bit line and responsive to a control signal to charge the bit line for a predefined time. Further, the circuit includes a diode coupled to the bit line and responsive to a read 1 operation to retain voltage of the bit line above a first threshold to render the inverter to read 1 from the bit cell. Moreover, the circuit includes a pull-up circuit coupled to the bit line and responsive to the read 1 operation to compensate charge sharing on the bit line between the inverter and the bit cell to prevent glitch at the inverter.

An example of a method for reading a bit cell includes charging a bit line for a predefined time. The method also includes retaining voltage of the bit line over a first threshold if it is a read 1 operation to generate a read 1 output. Further, the method includes discharging the bit line if it is a read 0 operation to generate a read 0 output.

BRIEF DESCRIPTION OF THE VIEWS OF DRAWINGS

In the accompanying figures, similar reference numerals may refer to identical or functionally similar elements. These reference numerals are used in the detailed description to illustrate various embodiments and to explain various aspects and advantages of the present disclosure.

DETAILED DESCRIPTION OF THE EMBODIMENTS

Figure 2:
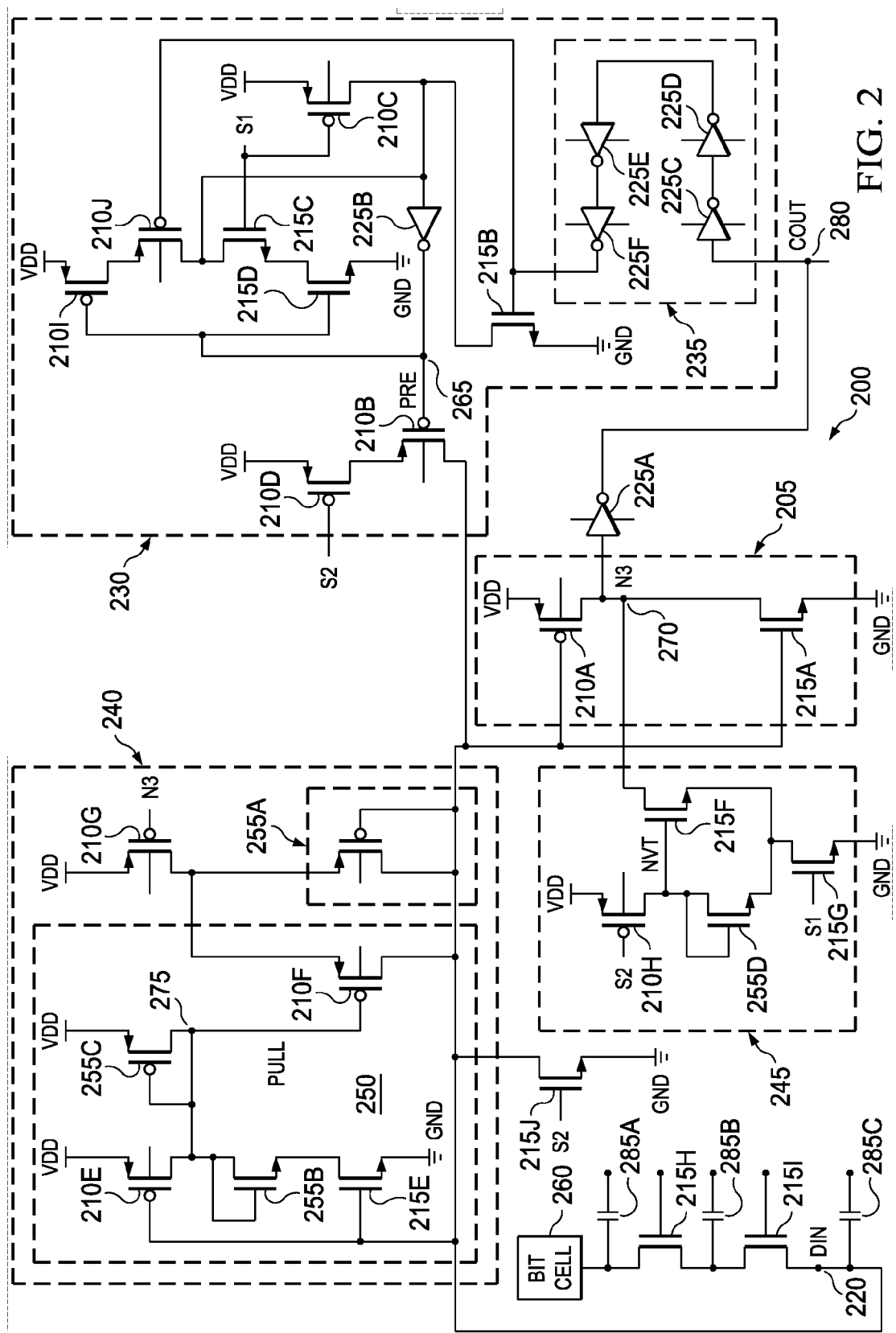
FIG. 2 is a sense amplifier circuit in accordance with one embodiment.

FIG. 2 illustrates a single-ended sense amplifier circuit 200, hereinafter referred to as the circuit 200. The circuit 200 includes an inverter 205. The inverter 205 includes a positive metal oxide semiconductor (PMOS) transistor 210A and a negative metal oxide semiconductor (NMOS) transistor 215A. The PMOS transistor 210A is skewed with respect to the NMOS transistor 215A for proper functioning across process, voltage and temperature variations. The circuit connection for the inverter 205 is as follows: A gate of the PMOS transistor 210A and a gate of the NMOS transistor 215A are coupled to a bit line 220 (DIN). A drain of the PMOS transistor 210A and a drain of the NMOS transistor 215A are coupled to an input terminal of an inverter 225A. The gate of the PMOS transistor 210A is also coupled to the gate of the NMOS transistor 215A, a source of the PMOS transistor 210A is coupled to a power supply (VDD), and a drain of the PMOS transistor 210A is coupled to the drain of the NMOS transistor 215A. A source of the NMOS transistor 215A is coupled to a ground supply (GND).

The circuit 200 also includes a first circuit, for example a pre-charge circuit 230. The circuit connection for the pre-charge circuit 230 is explained as follows: The pre-charge circuit 230 is coupled to the inverter 205 through the inverter 225A. The pre-charge circuit 230 includes a delay circuit 235. The delay circuit 235 includes one or more inverters, for example an inverter 225C, an inverter 225D, an inverter 225E, and an inverter 225F. The circuit connection for the delay circuit 235 is explained as follows: an input terminal of the inverter 225C is coupled to an output terminal of the inverter 225A and an output terminal of the inverter 225C is coupled to an input terminal of the inverter 225D. The output terminal of the inverter 225D is coupled to an input terminal of the inverter 225E. The output terminal of the inverter 225E is coupled to an input terminal of the inverter 225F.

The pre-charge circuit 230 also includes an inverter 225B, one or more PMOS transistors, for example a PMOS transistor 210B, a PMOS transistor 210C, a PMOS transistor 210D, a PMOS transistor 210J, and a PMOS transistor 210I. The pre-charge circuit 230 further includes one or more NMOS transistors, for example, an NMOS transistor 215B, an NMOS transistor 215C and an NMOS transistor 215D. The circuit connection of the delay circuit 235 with the one or more PMOS transistors and the one or more NMOS transistors is explained as follows: the output terminal of the inverter 225F is coupled to a gate of the NMOS transistor 215B. The NMOS transistor 215B has a drain coupled to an input terminal of an inverter 225B, a drain of the PMOS transistor 210J, a drain of the NMOS transistor 215C and a drain of the PMOS transistor 210C. A source of the NMOS transistor 215B is coupled to the ground supply. The gate of the NMOS transistor 215B is also coupled to the gate of the PMOS transistor 210J. The PMOS transistor 210C has the drain coupled to the input terminal of an inverter 225B, a drain of the PMOS transistor 210J, a drain of the NMOS transistor 215C. The PMOS transistor 210C has a gate coupled to a gate of the NMOS transistor 215C, and a source coupled to the power supply. The gate of the NMOS transistor 215C and the gate of the PMOS transistor 210C are responsive to a control signal, for example a signal S1. Control signals, for example the signal S1 and a signal S2, can be generated by a circuit external to the circuit 200. The signal S1 and the signal S2 enable the circuit 200 to read data stored in a bit cell 260 coupled to the bit line 220. The signal S2 is an inverted version of the signal S1. The NMOS transistor 215C has a source coupled to a drain of the NMOS transistor 215D and the drain coupled to the input terminal of an inverter 225B. The NMOS transistor 215D has a source coupled to the ground supply, and a gate coupled to a gate of the PMOS transistor 210I and a gate of the PMOS transistor 210B. The PMOS transistor 210I has a source coupled to the power supply, the gate coupled to the gate of the PMOS transistor 210B, and a drain coupled to a drain of the PMOS transistor 210J. An output terminal of the inverter 225B is coupled to the gate of the PMOS transistor 210B, a gate of the NMOS transistor 215D, and a gate of the PMOS transistor 210I. The PMOS transistor 210B has a source coupled to a drain of the PMOS transistor 210D, and a drain coupled to the bit line 220 The PMOS transistor 210D has a source coupled to the power supply, and a gate responsive to the signal S2. In some embodiments, the pre-charge circuit 230 may not include the delay circuit 235 and other transistors. The pre-charge circuit 230 can include the PMOS transistor 210D and the PMOS transistor 210B, and signals S2 and a signal PRE at a node 265 can be generated externally and provided to the pre-charge circuit 230.

The circuit 200 also includes a second circuit 240. The second circuit 240 includes a pull-up circuit 250 and a diode 255A. The pull-up circuit 250 includes a plurality of diodes, for example a diode 255B, and a diode 255C. The plurality of diodes may be transistor based diodes. The circuit connection for the diode 225A is explained as follows: The diode 255A is coupled to the bit line 220. The diode 255A can be a transistor based diode having a source coupled to a drain of the PMOS transistor 210G and a source of the PMOS transistor 210F, a drain and a gate coupled to the bit line 220. The diode 255A has a threshold equivalent to that of the PMOS transistor 210A, and hence the diode 255A can be referred to as a mirror-match of the PMOS transistor 210A. The circuit connection of the diode 225A with the pull-up circuit 250 is explained as follows The PMOS transistor 210G has a source coupled to the power supply, a drain coupled to a source of the PMOS transistor 210F, and a gate responsive to a signal N3 generated by a feedback circuit. For example, the feedback circuit may include a PMOS transistor 210G coupled to the inverter 205 through the diode 225A. The signal N3 may be an output signal generated by the inverter 205 at a node 270. The PMOS transistor 210F has a drain coupled to the bit line 220, and a gate coupled to the diode 255C, a drain of the PMOS transistor 210E, the diode 255B. The PMOS transistor 210E has a source coupled to power supply, a gate coupled to a gate of the NMOS transistor 215E and the bit line 220, and the drain coupled to the diode 255C and the diode 255B. The NMOS transistor 215E has a gate coupled to the bit line 220 a source coupled to the ground supply, and has a drain coupled to the diode 255B.

The circuit 200 also includes a third circuit 245. The third circuit 245 includes one or more transistors, for example a PMOS transistor 210H, a NMOS transistor 215G, a NMOS transistor 215F. The third circuit 245 also includes a transistor based diode, for example a diode 255D. The circuit connection for the third circuit is explained as follows: The PMOS transistor 210H has a gate responsive to the signal S2, a source coupled to the power supply, and a drain coupled to the diode 255D and a drain of the NMOS transistor 215F. The diode 255D is further coupled to a drain of the NMOS transistor 215G. The NMOS transistor 215G has a source coupled to the ground supply, and a gate responsive to the signal S1. The drain of the NMOS transistor 215G is also coupled to a source of the NMOS transistor 215F. The NMOS transistor 215F, a gate coupled to the diode 255D, and a drain coupled to the node 270 of the inverter 205.

The bit line 220 is also coupled to a drain of a NMOS transistor 215J. The NMOS transistor has a gate responsive to the signal S2 and a source coupled to the ground supply.

The circuit 200 is a single-ended sense amplifier circuit. The circuit 200 is used to detect or sense or read data stored in a bit cell 260 coupled to the bit line 220. The bit cell 260 is at least one of a read only memory, a content-addressable memory and a single-ended-read random access memory. The working of the circuit 200 can be divided into phases, for example a first phase and a second phase. The first phase can be referred to as initial phase where the circuit 200 is initialized for enabling reading of the bit cell 260 in the second phase.

The pre-charge circuit 230 is responsive to the signal S1 to charge the bit line 220 for a predefined time in the first phase. The diode 255A is responsive to a read 1 operation in the second phase to retain voltage of the bit line 220 above a first threshold to render the inverter 205 to read 1 from the bit cell 260. The first threshold can be defined as a maximum value of a voltage of the bit line that can activate the PMOS transistor 210A and hence lead to a false read operation. The pull-up circuit 250 is responsive to the read 1 operation in the second phase to compensate charge sharing on the bit line 220 between the inverter 205 and the bit cell 260 to prevent glitch at the inverter 205. The third circuit 245 is responsive to the signal S1 and the signal S2 to render the inverter 205 to read 1 from the bit cell 260 when a voltage supply of the PMOS transistor 210A falls below or becomes equal to a second threshold. The second threshold is a maximum value of the voltage supply that can activate the PMOS transistor 210A and hence lead to the false read operation.

The working of the circuit 200 in different phases is described in detail as follows: Initially, the signal S1 is at a logic level LO and the signal S2 is at a logic level HI. The signal S1 activates the PMOS transistor 210C to bring the signal PRE at the node 265 to the logic level LO. In the first phase, the signal S1 moves from the logic level LO to the logic level HI. The signal S2 moves to the logic level LO and activates the PMOS transistor 210D. The bit line 220 gets charged as the PMOS transistor 210D and the PMOS transistor 210B are active. The bit line 220 is charged for a predefined time. The predefined time can be defined as time needed to charge the bit line 220. In one aspect, the predefined time is the time during which the signal PRE at the node 265 is at the logic level LO. When the signal PRE at the node 265 moves to the logic level HI, the PMOS transistor 210B becomes inactive and stops the charging of the bit line 220. The signal PRE at the node 265 can be moved to the logic level HI using the delay circuit 235. The NMOS transistor 215B is active to drive the signal PRE at the node 265 to the logic level HI.

The signal S1 at the logic level HI activates the NMOS transistor 215G of the third circuit 245. The signal S2 at logic level LO drives the PMOS transistor 210H to activate the NMOS transistor 215F. The NMOS transistor 215F and the NMOS transistor 215G drive the signal N3 at the node 270 to the logic level LO.

The second phase starts when the signal PRE at the node 265 moves to logic level HI which in turn inactivates the pre-charge circuit 230. In the second phase, the circuit 200 performs a read 1 operation or enables a read 0 operation.

In case of a read 1 operation, the bit cell 260 is inactive. In one example, the bit cell 260 is an NMOS transistor which is inactive. The bit line 220 having a signal at the logic level HI, due to the charging, activates the NMOS transistor 215E and pulls a signal PULL at a node 275 below a voltage sufficient to activate the PMOS transistor 210F. The PMOS transistor 210E is inactive. The signal N3 at the node 270 is provided as a feedback to the PMOS transistor 210G. The signal N3 at the logic level LO activates the PMOS transistor 210G pulling the bit line 220 above VDD-VTH, where VTH is a threshold voltage of the PMOS transistor 210A and the diode 255A. The diode 255A retains the voltage of the bit line 220 above the first threshold. In one example, the PMOS transistor 210A and the diode 255A are coupled to same word line to ensure similar threshold voltage. The word line may be a read word line in the memory cell. The word line controls the bit line 220 to access the bit cell 260. To read the bit from the bit cell 260 a full voltage may be applied to the read word line. The PMOS transistor 210F and the PMOS transistor 210G are active and compensates charge sharing on the bit line 220 to prevent glitch at the inverter 205. The charge sharing can occur between one or more capacitors coupled to one or more multiplexers. The one or more multiplexers may be coupled between the bit cell 260 and the inverter 205. For example, a capacitor 285A coupled between a LMUX 215H and the bit cell 260, a capacitor 285B coupled between to a GMUX 215I and the LMUX 215H, and a capacitor 285C coupled to the bit line 220 and the GMUX 215I.

The pull-up circuit 250 also prevents voltage of the bit line 220 from falling below or becoming equal to VDD-VTH due to charge sharing and hence prevents activation of the PMOS transistor 210A which may lead to a false read operation.

The NMOS transistor 215A is active to enable the circuit 200 to read 1 from the bit cell 260. The signal N3 at the node 270 is at the logic level LO and an output signal (COUT) at a node 280 is at the logic level HI. The output signal at the logic level HI at the node 280 is referred to as reading 1 from the bit cell 260.

It might happen that the voltage supply falls below or becomes equal to the second threshold which in turn may lead to inactivation of the NMOS transistor 215A. The third circuit 245, for example a bleeder NMOS circuit, ensures that the signal N3 at the node 270 is maintained at the logic level LO when the voltage supply falls below or becomes equal to the threshold. Hence the output signal at the node 280 is maintained at the logic level HI and wider range of the voltage supply can be used. The read operation is performed using the inverter 205 which reads from the bit cell 260.

In case of a read 0 operation, the bit cell 260, for example the NMOS transistor, is active. The bit cell 260 pulls a signal at the bit line 220 to the logic level LO. The PMOS transistor 210E becomes active, and pulls the signal PULL at the node 275 to the logic level HI which in turn inactivates the PMOS transistor 210F. The signal at the logic level LO at the bit line 220 activates the PMOS transistor 210A. The PMOS transistor 210A pulls the signal N3 at the node 270 to the logic level HI. The output signal moves to the logic level LO at the node 280 and hence a read 0 is performed. The third circuit 245 is weaker as compared to the PMOS transistor 210A. The signal N3 at the logic level HI at the node 270 inactivates the PMOS transistor 210G and hence cuts-off the diode 255A and the pull-up circuit 240 from the bit line 220.

It is noted that the bit cell 260 can be a PMOS transistor or an NMOS transistor or a combination of PMOS transistors and NMOS transistors.

Figure 1:
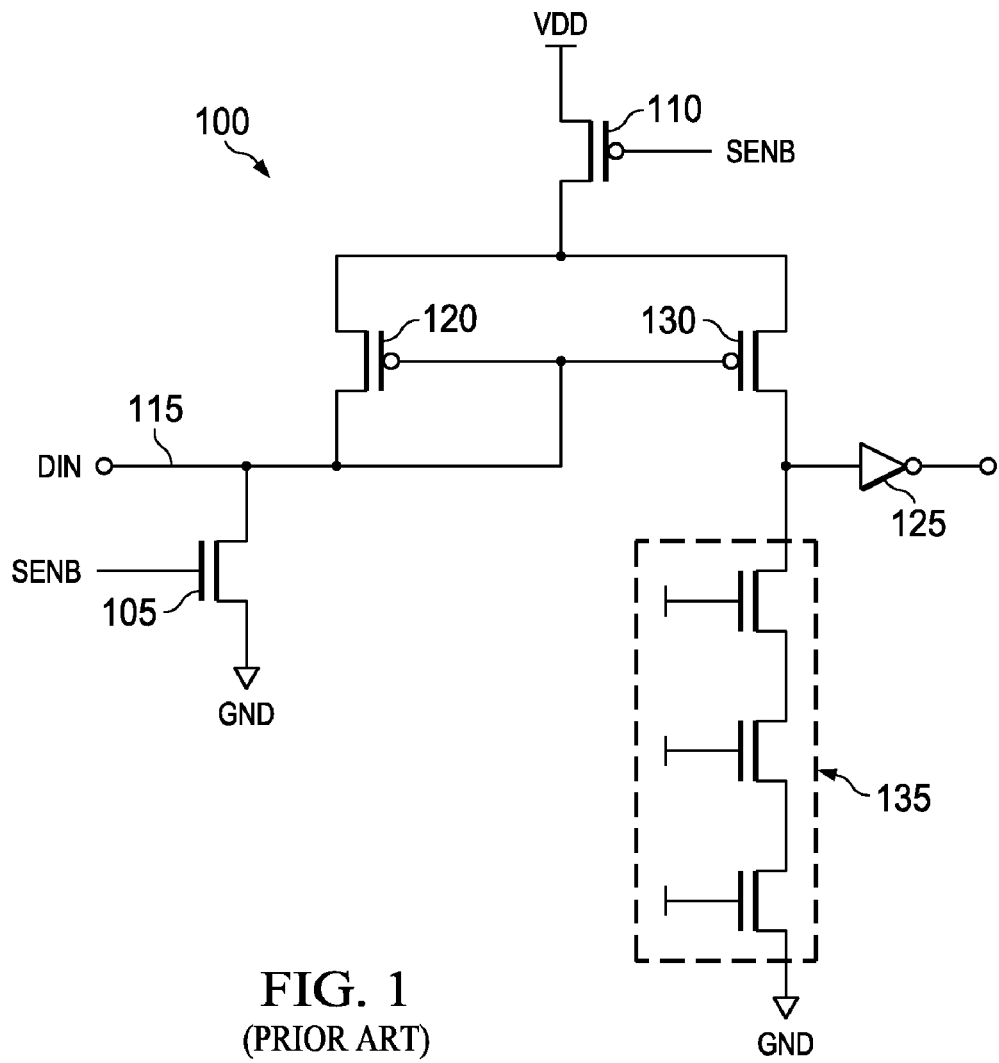
FIG. 1 (Prior Art) is a single-ended sense amplifier circuit in accordance with the prior art.
Figure 3:
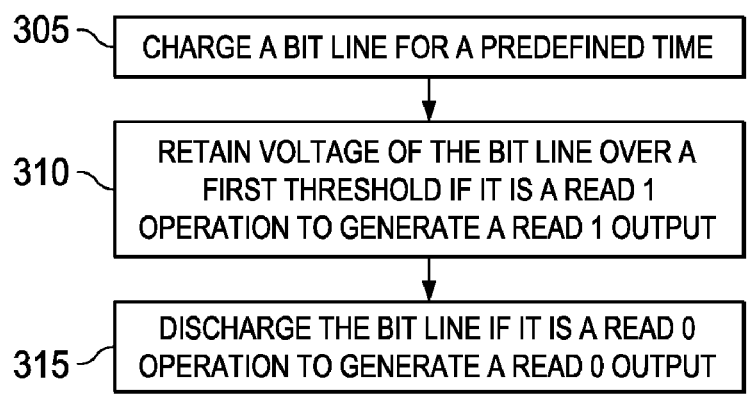
FIG. 3 is a flow diagram illustrating a method for reading a bit cell in accordance with one embodiment.

FIG. 3 is a flow diagram illustrating a method for reading a bit cell.

At step 305, a bit line, for example the bit line 220 of the circuit 220, is charged for the predefined time.

At step 310, voltage of the bit line is retained, for example by using a diode, for example the diode 255A, over the first threshold for a read 1 operation to generate a read 1 output. If the voltage of the bit line falls below the first threshold a false read operation may be performed. The voltage of the bit line may fall below the first threshold due to charge sharing on the bit line. The compensation of charge sharing, for example by using the pull-up circuit 250, retains the bit line over the first threshold. The bit line is also retained above the first threshold, for example by using the third circuit 245, when the voltage supply falls below or becomes equal to the second threshold to generate the read 1 output.

At step 315, the bit line is discharged for a read 0 operation to generate a read 0 output. A feedback signal can be generated to cut-off a circuit that performs step 310. The feedback signal may be generated by the pre-charge circuit 230.

Figure 4A:
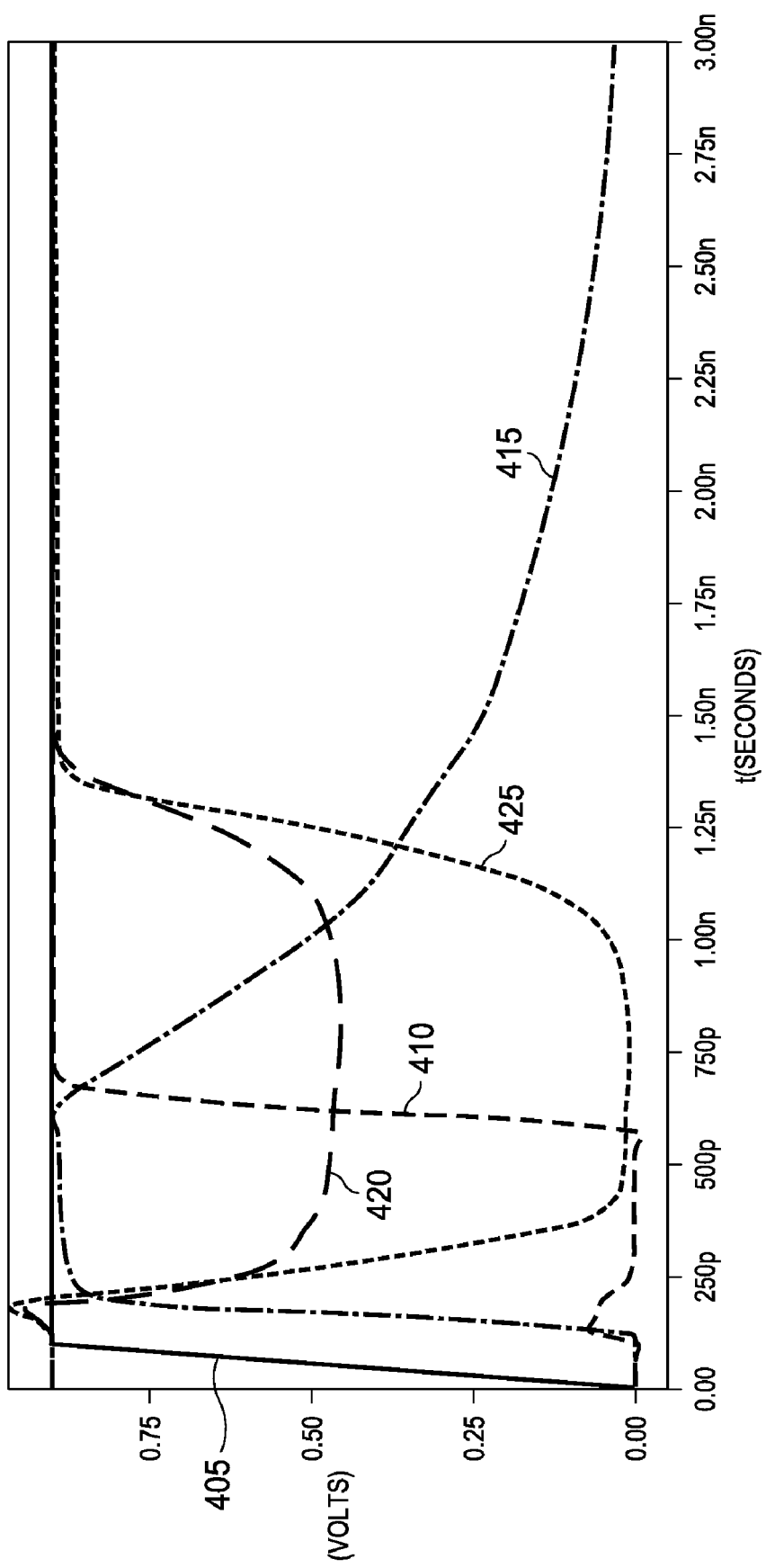
FIG. 4A is a graphical representation of signals for a read 0 operation in accordance with one embodiment.

FIG. 4A is a graphical representation of signals for a read 0 operation. Y-axis represents voltage, in volts, and X-axis represents time in seconds. A waveform 405 corresponds to the signal S1, a waveform 410 corresponds to the signal PRE, a waveform 415 corresponds to the bit line 220, a waveform 420 corresponds to the signal PULL, and a waveform 425 corresponds to the N3 signal.

The first phase ends at 1.35 nanoseconds. During the first phase, the waveform 405 is at the logic level HI, the waveform 410 is at the logic level HI, the waveform 415 is at the logic level HI, the waveform 420 is at 0.5 volts, and the waveform 425 is at the logic level LO.

The second phase starts at 1.35 nanoseconds. During the second phase, the waveform 405 is at the logic level HI, the waveform 410 is at the logic level HI, the waveform 415 is at the logic level LO, the waveform 420 is at the logic level HI, and the waveform 425 is at the logic level HI.

Figure 4B:
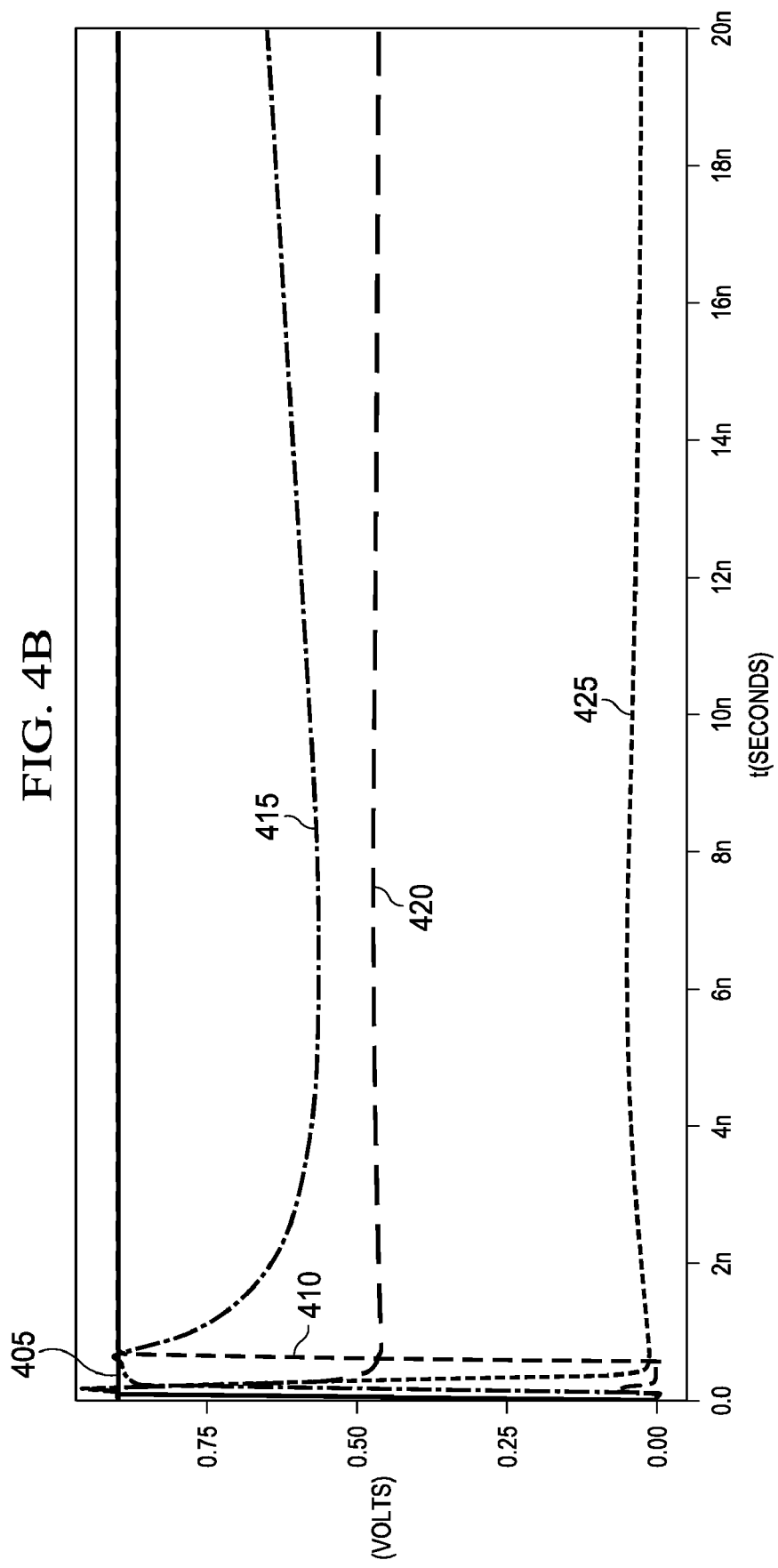
FIG. 4B is a graphical representation of signals for a read 1 operation in accordance with one embodiment.

FIG. 4B is a graphical representation of the signals for a read 1 operation. Y-axis represents voltage, in volts, and X-axis represents time in seconds. The first phase ends at 1 nanosecond. During the first phase, the waveform 405 is at the logic level HI, the waveform 410 is at the logic level LO, the waveform 415 is at the logic level HI, the waveform 420 is at 0.4 volts, and the waveform 425 is at the logic level HI.

The second phase starts at 1 nanosecond. During the second phase, the waveform 405 is at the logic level HI, the waveform 410 is at the logic level HI, the waveform 415 is at 0.6 volts, the waveform 420 is at 0.5 volts, and the waveform 425 is at the logic level LO.

Various embodiments of the present disclosure help in achieving robust read 0 and read 1 operation. The circuit 200 ensures higher speed during read operations.

In the foregoing discussion, the term "coupled" refers to either a direct electrical connection between the devices coupled or an indirect connection through intermediary devices. The term "circuit" means at least either a single component or a multiplicity of components, that are coupled together to provide a desired function. The term "signal" means at least one current, voltage, charge, data, or other signal.

Those skilled in the art will recognize that a wide variety of modifications, alterations, and combinations can be made with respect to the above described embodiments without departing from the scope of the disclosure, and that such modifications, alterations, and combinations are to be viewed as being within the ambit of the disclosure.

What is claimed is:

1. A sense amplifier comprising:
   A. a bit line;
   B. first inverter circuitry having a PMOS transistor and an NMOS transistor connected in series between VDD and ground, the PMOS and NMOS transistors having gate leads connected to the bit line, and the inverter having a node between the PMOS and NMOS transistors that is connected to a first output lead;
   C. second inverter circuitry having an input connected to the first output lead and having a second output lead;
   D. delay circuitry having an input connected to the second output lead and having a delay output lead;
   E. precharge circuitry having an input connected to the delay output lead, having a control input, and having an output connected to the bit line; and
   F. pull-up circuitry having an input connected to VDD, having an input connected to the node of the first inverter circuitry, and having an output connected to the bit line.

2. The sense amplifier of claim 1 including a bit cell of a memory device.

3. The sense amplifier of claim 1 in which the delay circuitry includes inverters connected in series between the second output lead and the delay output lead.

* * * * *